United States Patent
Stamper et al.

(10) Patent No.: US 9,728,509 B1
(45) Date of Patent: Aug. 8, 2017

(54) LASER SCRIBE STRUCTURES FOR A WAFER

(71) Applicant: GLOBALFOUNDRIES INC., Grand Cayman (KY)

(72) Inventors: Anthony K. Stamper, Burlington, VT (US); Edward C. Cooney, III, Jericho, VT (US); Laurie M. Krywanczyk, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/147,525

(22) Filed: May 5, 2016

(51) Int. Cl.
| | |
|---|---|
| *H01L 23/544* | (2006.01) |
| *H01L 23/528* | (2006.01) |
| *H01L 23/58* | (2006.01) |
| *H01L 21/768* | (2006.01) |
| *H01L 21/268* | (2006.01) |
| *H01L 21/3105* | (2006.01) |
| *H01L 21/304* | (2006.01) |
| *H01L 23/532* | (2006.01) |

(52) U.S. Cl.
CPC .......... *H01L 23/544* (2013.01); *H01L 21/268* (2013.01); *H01L 21/304* (2013.01); *H01L 21/31051* (2013.01); *H01L 21/768* (2013.01); *H01L 23/528* (2013.01); *H01L 23/585* (2013.01); *H01L 23/5329* (2013.01); *H01L 23/53223* (2013.01); *H01L 23/53238* (2013.01); *H01L 23/53252* (2013.01); *H01L 2223/54406* (2013.01); *H01L 2223/54433* (2013.01)

(58) Field of Classification Search
CPC ................. H01L 21/268; H01L 21/304; H01L 21/31051; H01L 21/768
See application file for complete search history.

(56) References Cited

U.S. PATENT DOCUMENTS

| | | | | |
|---|---|---|---|---|
| 5,401,691 A | * | 3/1995 | Caldwell | H01L 23/544 257/E23.179 |
| 5,898,227 A | * | 4/1999 | Geffken | G03F 7/091 257/797 |
| 5,923,996 A | * | 7/1999 | Shih | H01L 23/544 257/E23.179 |
| 6,017,662 A | | 1/2000 | Lee | |
| 6,121,111 A | | 9/2000 | Jang et al. | |
| 6,590,274 B2 | * | 7/2003 | Ohsumi | H01L 23/544 257/620 |

(Continued)

FOREIGN PATENT DOCUMENTS

| | | |
|---|---|---|
| JP | 6244068 | 9/1994 |
| JP | 2007109822 | 4/2007 |

(Continued)

*Primary Examiner* — Peniel M Gumedzoe
(74) *Attorney, Agent, or Firm* — Thompson Hine LLP; Anthony Canale

(57) ABSTRACT

Structures that include an identification marking and fabrication methods for such structures. A chip is formed within a usable area of a wafer, and a marking region is formed on the wafer. The marking region is comprised of a conductor used to form a last metal layer of an interconnect structure for the chip. The identification marking is formed in the conductor of the marking region. After the identification marking is formed, a dielectric layer is deposited on the marking region. The dielectric layer on the marking region is planarized.

13 Claims, 4 Drawing Sheets

(56) References Cited

U.S. PATENT DOCUMENTS

| | | |
|---|---|---|
| 7,319,073 B2 | 1/2008 | Jhang |
| 8,785,813 B2 | 7/2014 | Shah et al. |
| 2007/0218630 A1* | 9/2007 | Yamaguchi ............ B81B 3/001 438/257 |
| 2007/0272666 A1 | 11/2007 | O'Brien et al. |
| 2011/0021025 A1 | 1/2011 | Hashii et al. |
| 2012/0184068 A1* | 7/2012 | Abe ...................... H01L 21/561 438/107 |
| 2016/0133486 A1* | 5/2016 | Andry ................... H01L 21/784 428/40.4 |

FOREIGN PATENT DOCUMENTS

| | | |
|---|---|---|
| KR | 100698098 | 3/2007 |
| KR | 20070069988 | 7/2007 |
| KR | 100817821 | 3/2008 |
| TW | 559978 | 11/2003 |

\* cited by examiner

LASER SCRIBE STRUCTURES FOR A WAFER

BACKGROUND

The invention relates generally to semiconductor devices and integrated circuit fabrication and, in particular, to structures including identification markings and methods for making such structures.

A wafer is a thin slice of semiconductor material, such as a crystalline silicon, used in electronics for the fabrication of integrated circuits. The wafer serves as the substrate for microelectronic devices built in and over the wafer, and undergoes many microfabrication process steps such as doping or ion implantation, etching, deposition of various materials, and photolithographic patterning. Chips are fabricated in parallel across the surface area of the wafer in repeating patterns using a set of masks to replicate the device structures of the integrated circuits. The individual chips are separated by dicing and packaged for end use.

A machine-readable backside wafer identification marking is commonly used to identify the wafer during processing. Wafers are commonly thinned after front side processing and before dicing using, for example, a back side grind that can remove the identification marking. In this instance, provisions may be made to maintain an identification marking that is associated with the wafer. In this regard, an approach is to laser scribe a portion of the wafer front side with a unique identification marking. The wafer identification marking is commonly transferred to a front side of the wafer in a "clear cell" marking region using a laser scribe. The laser scribing process alters the surface topography to construct characters or symbols representing the identification marking. However, the surface alteration may also introduce surface roughness and debris as artifacts of the process forming the marking. The surface roughness and debris reduce planarity and may produce defectivity that reduces yield.

Improved structures including identification markings and methods for making such structures are needed.

SUMMARY

In an embodiment of the invention, a structure includes a wafer having a usable area, a metal wiring region, and a chip within the usable area. The structure further includes a marking region on the wafer, an identification marking in the marking region, and a dielectric layer on the marking region and the metal wiring region. The dielectric layer has a planarized top surface.

In an embodiment of the invention, a method is provided for fabricating a structure on a wafer. The method includes forming a chip within a usable area of the wafer, forming a metal wiring region on the wafer, and forming a marking region on the wafer. After an identification marking is formed in the marking region, a dielectric layer is deposited on the marking region and the metal wiring region, and subsequently planarized.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
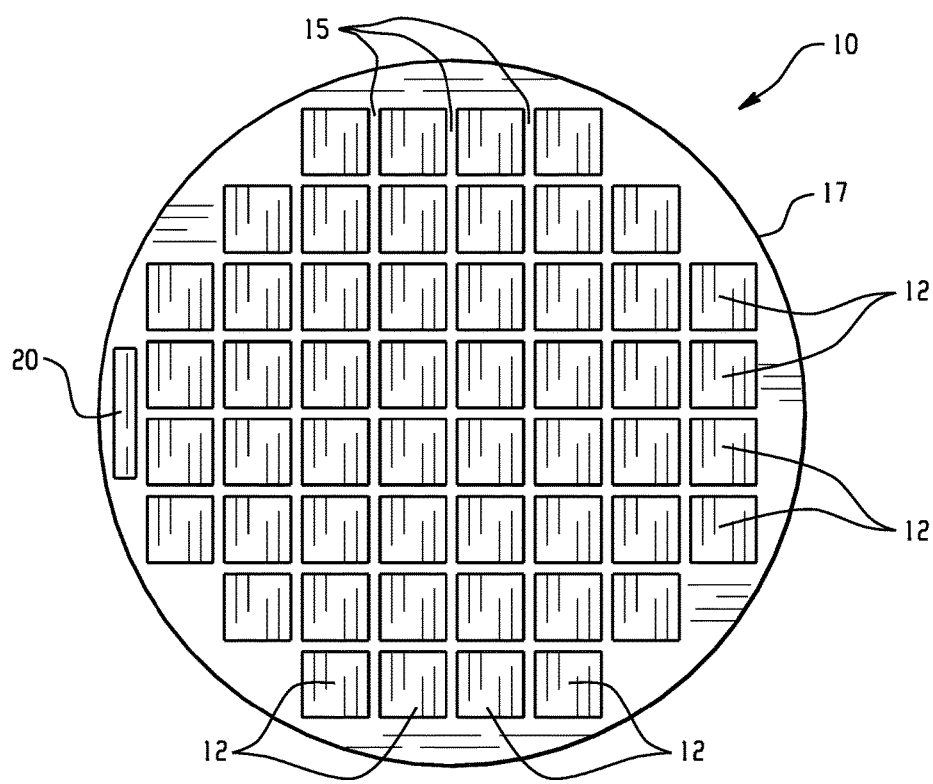
FIG. 1 is a diagrammatic top view of a wafer carrying multiple chips in accordance with an embodiment of the invention.
Figure 1A:
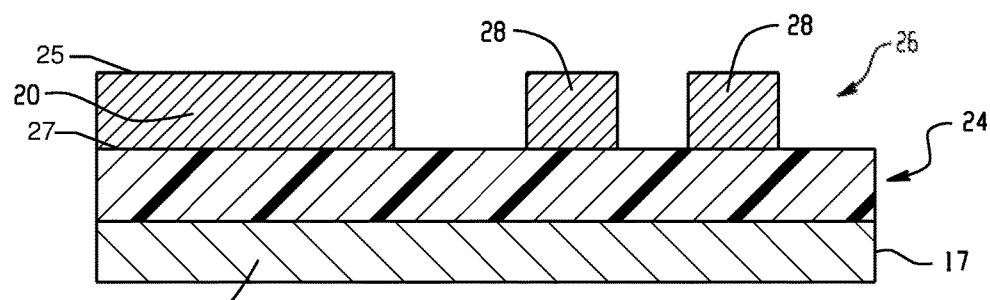
FIG. 1A is a cross-sectional view of a portion of the wafer in FIG. 1 including the marking region near the wafer rim.

With reference to FIGS. 1, 1A and in accordance with an embodiment of the invention, a wafer 10 includes a usable chip area on its front side that has been processed by front-end-of-line (FEOL), middle-of-line (MOL) and/or back-end-of-line (BEOL) processes to fabricate a plurality of substantially identical chips 12. Each of the chips 12 can contain one or more smaller chips that can be diced and packaged. Each chip 12 includes one or more integrated circuits, such as transistors, capacitors, wires, vias, inductors, capacitors, etc., implementing chip functionality and providing an active chip region. The chips 12 may be arranged in an array of rows and columns, and scribe lines 15 may be present between adjacent pairs of chips 12 in the array. The scribe lines 15 represent cutting lines along which the chips 12 may be diced by cutting operations using a saw or a laser, and then encapsulated in respective packages. The number of chips 12 yielded from the wafer 10 is a function of the individual chip size, as well as the wafer size. Round wafer sizes for the wafer 10 may range from a diameter of 100 millimeters, or smaller, to a diameter of 450 millimeters, or larger.

The wafer 10 may be comprised of a crystalline semiconductor material, such as single crystal silicon, used in the fabrication of the chips 12 and may be lightly doped with an impurity to alter its electrical properties. For example, the wafer may be a bulk single crystal silicon wafer or a silicon-on-insulator (SOI) wafer that includes a thick silicon handle substrate, a thin buried oxide layer (BOX), and a thin top silicon device layer.

An uppermost or top wiring layer 26 is formed on each of the chips 12 by MOL and/or BEOL processing. The wiring layer 26 may be part of an interconnect structure, which may be comprised of wiring layers coupled with the integrated circuits and may include as many as eight or more wiring layers that supply conductive paths for signals, clock, power, etc. The interconnect structure may include pads or another type of connect structure providing external connections. Passive circuit elements, such as diodes, transistors, MEMS, filters, resistors, capacitors, varactors, and inductors, may be integrated into the interconnect structure.

The uppermost wiring layer 26 may include a wiring region in the form of wires 28 that are formed by deposition and subtractive etching. The wires 28, which are located over the active chip region and in the usable area, may be used as lines to communicate signals and transfer power across each chip 12.

A marking region 20 is disposed near an outer peripheral edge 17 of the wafer 10, and consumes a portion of the available surface area of the wafer 10 to the exclusion of the usable chip area that includes the active chip region. The marking region 20 may be composed of metal from an unpatterned area of one or more wiring levels on the chips 12. In the representative embodiment, the marking region 20 is comprised of metal in an unpatterned area of the uppermost wiring level on the wafer 10. In contrast to the wires 28, the marking region 20 is not used for making such electrical connections and is not an element or component of any of the chips 12, and the portion of the wafer 10 underlying the marking region 20 may be free of device structures of the integrated circuit.

The marking region 20 and wires 28 may be formed as a patterned metal layer on a top surface 27 of a dielectric layer 24 in the top wiring layer 26. In certain embodiments, the thickness or height of the marking region 20 and the wires 28 may be greater than or equal to 4 µm. In a plane transverse to the height, the dimensions of marking region 20 may be large in comparison with the dimensions of the wires 28. For example, the size of the marking region 20 may be 20 mm wide and 10 mm long, and the width of wires 28 may range from 0.1 microns to 100 microns. The marking region 20 has a top surface 25 that may be planar and coplanar with respective top surfaces of the wires 28.

Candidate conductive materials for the conductor in the wiring layer 26 include, but are not limited to, aluminum (Al), copper (Cu), gold (Au), or an alloy of these metals; and may contain thin cladding or liner materials such as Ti, Ta, Cr, or alloys thereof. These types of metals may be deposited by, for example, atomic layer deposition, chemical vapor deposition, physical vapor deposition, an electrochemical process (e.g., electroplating or electroless plating), etc. In particular, the marking region 20 and the wires 28 may be composed of aluminum cladded with a thin Ti/TiN layer underneath and TiN above, and patterned by subtractive aluminum etching. The dielectric layer 24 may be comprised of any suitable organic or inorganic dielectric material, such as silicon dioxide ($SiO_2$), polyimide, hydrogen-enriched silicon oxycarbide (SiCOH), fluorosilicate glass (FSG), or another type of low-k dielectric material that may be deposited by chemical vapor deposition, spin-on, etc.

Figure 2:
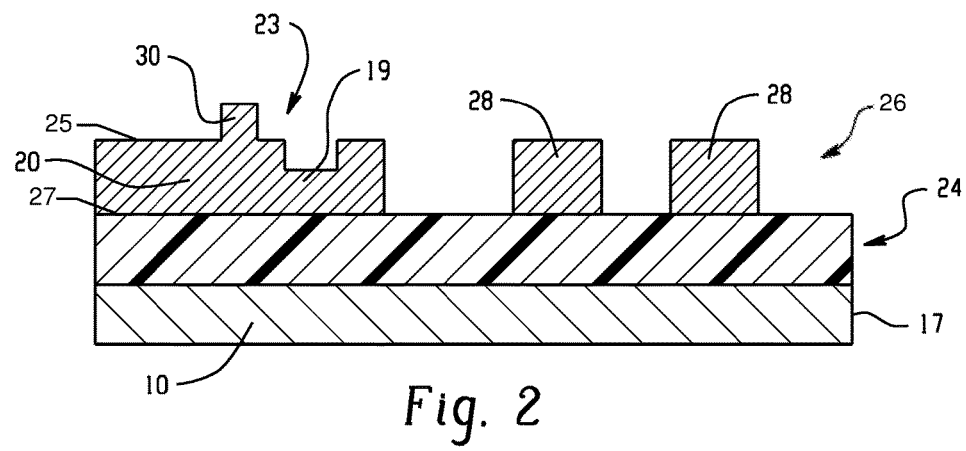
FIG. 2 is a cross-sectional view similar to FIG. 1A after an identification marking has been formed in the marking region.
Figure 2A:
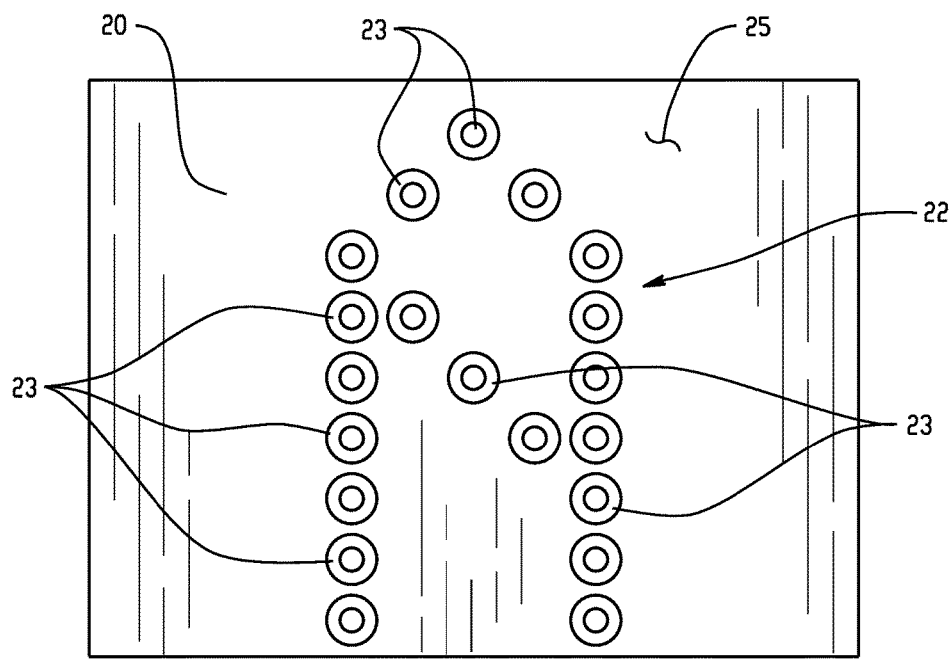
FIG. 2A is an enlarged view of a portion of FIG. 2.

With reference to FIGS. 2, 2A in which like reference numerals refer to like features in FIGS. 1, 1A and in accordance with an embodiment of the invention, an identification marking 22 is formed as a physical mark in the marking region 20. For example, the identification marking 22 may include one or more segments that specify a part or serial number encoding an identification code for the wafer 10. Alternatively, the identification marking 22 may encode and convey other types of information either instead of, or in addition to, the part or serial number. Process history and metrology data for the wafer 10 may be stored in a database that is indexed by the identification marking 22.

The identification marking 22 in the marking region 20 may be spaced inward from the outer peripheral edge 17 of the wafer 10 by a distance in an annular zone or ring that is proportional to the amount of a wafer edge grinding operation. The wafer edge grinding operation may be used, for example, to reduce the likelihood of wafer breakage, cracks, and/or particle generation when the wafer 10 is to participate in wafer bonding. In an embodiment, the identification marking 22 in the marking region 20 may be spaced inward from the outer peripheral edge 17 of the wafer 10 by 0.1 millimeters to 3 millimeters to take into account for the semiconductor material of the wafer lost at the outer peripheral edge 17 during the wafer edge grinding operation.

The information contained in the identification marking 22 may be readable and, in particular, may be readable from an image of the one or more segments of the identification marking 22 using optical character recognition. Once read, the segments of the identification marking 22 may be readily interpreted for various uses, such as tracing process history and/or metrology data for the wafer 10. In an embodiment, the segments of the identification marking 22 may include (numeric or alphanumeric) characters and/or symbols. In the representative embodiment, the identification marking 22 includes only a single segment for purposes of illustration. However, the identification marking 22 may include any number of individual segments that are arranged to provide an identification code.

Each individual feature or element 23 of the identification marking 22 may extend from the top surface 25 of the marking region 20 at least partially through the thickness of the conductor of the marking region 20, as in the representative embodiment. In an alternative embodiment, each individual element 23 of the identification marking 22 may extend from the top surface 25 of the marking region 20 completely through the thickness of the conductor to or past the top surface 27. In an embodiment, the elements 23 of the identification marking 22 may be composed of multiple individual dots that are arranged to construct the one or more segments. The elements 23 may be formed using a laser beam to modify the metal of the marking region 20 by locally melting or ablating the metal. In an embodiment, the elements 23 in the identification marking 22 may be arranged to represent (numeric or alphanumeric) characters and/or symbols in a visually recognizable manner. These characters may represent the wafer identification that was scribed into the wafer backside prior to FEOL processing and that would be removed if the wafer backside is thinned by grinding following MOL or BEOL processing. The laser beam melts or ablates the metal in the marking region 20, leaving recessed portions 19 and raised portions 30 in the metal that define the elements 23 as best shown in FIG. 2. The identification marking 22 is readable due to this melting of the metal and subsequent creation of topography manifested in recessed portions 19 and raised portions 30. The raised portions 30 project above the plane of the top surface 25 of the marking region 20, and the recessed portions 19 are depressed below the same referenced plane.

Figure 3:
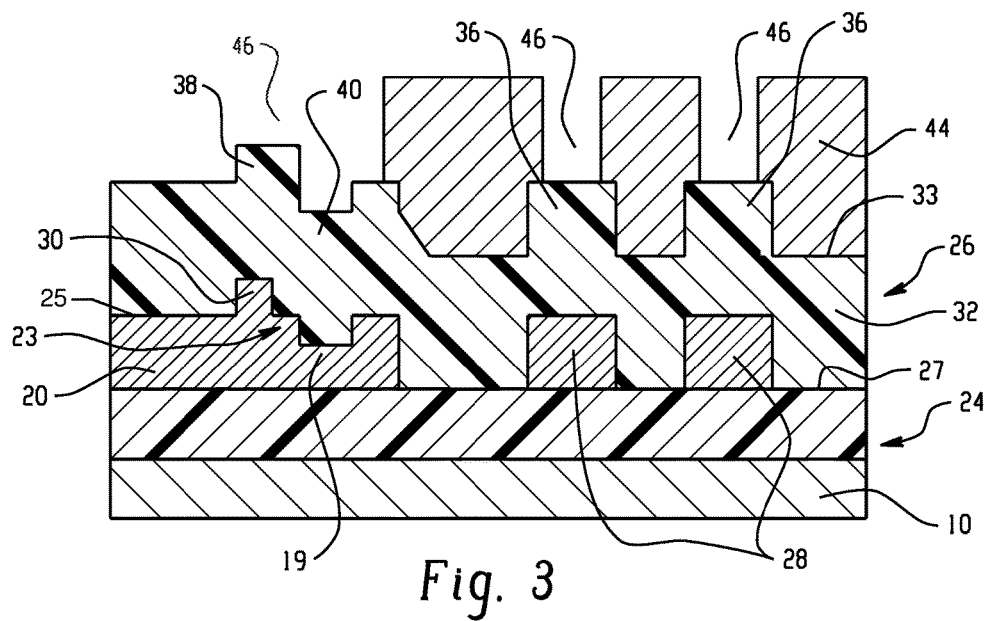
FIGS. 3-6 are cross-sectional views of a portion of the wafer in FIG. 1 illustrating successive stages of a fabrication process forming a structure including an identification marking in a back-end-of-line metallization and a planarized passivation layer in accordance with an embodiment of the invention.

With reference to FIG. 3 in which like reference numerals refer to like features in FIGS. 2, 2A and in accordance with an embodiment of the invention, a dielectric layer 32 is formed as a passivation layer extending across the marking region 20 and the uppermost wiring layer 26. The dielectric material constituting the dielectric layer 32 may be comprised of, for example, silicon oxide, deposited by chemical vapor deposition and may be conformal with a uniform thickness. The dielectric layer 32 may be comprised of oxide that is deposited by chemical vapor deposition. In an embodiment, the oxide may be deposited by high density plasma chemical vapor deposition (HDPCVD) process in which the oxide formed over the wires 28 will be thinner than the oxide formed over the marking region 20 of larger dimensions than the wires 28. Alternatively, a combination of HDPCVD deposition and non-HDPCVD deposition can be used to form the dielectric layer 32. At minimum, the thickness of the dielectric layer 32 should be greater than the thickness of the metal layer constituting the wires 28 and marking region 20. In one embodiment, the thickness of the metal layer constituting the wires 28 and marking region 20 is 4 microns and the thickness of dielectric layer 32, at least in a portion 40 of dielectric layer 32, is 6 microns.

Non-planar portions 38, 40 of the dielectric layer 32 define regions that acquire the underlying topography of the wires 28 and marking region 20. The non-planar recessed portions 19 and raised portions 30 in the laser-marked marking region 20 propagate to the surface 33 of the dielectric layer 32, which results in the non-planar portions 38 and 40. These non-planar portions 38 and 40 of the dielectric layer 32 can cause poor adhesion during a subsequent wafer bonding step. For example, if another wafer were bonded to wafer 10 using oxide-to-oxide bonding, adhesive bonding, eutectic metal bonding, etc., this topography can cause poor bonding, which could result in delamination or other defect issues.

A reverse mask planarization process may be used to reduce the unevenness of the surface topography of the dielectric layer 32 and improve the planarity of a top surface 33 of the dielectric layer 32 resulting in a subsequent polishing process. A reverse mask layer 44 is formed from a radiation-sensitive resist that is applied on the dielectric layer 32 and patterned with a conventional photolithography process. The resist may be applied by a spin coating process and then heated in a soft baking or pre-baking process to drive off excess solvent and to promote partial solidification. In the representative embodiment using a positive photoresist photolithography process, the resist over the wires 28 is exposed to radiation imaged using a photomask, baked after exposure, and developed to define a pattern of resist with openings 46. In addition, the photoresist in the marking region 20 is also exposed and developed to define an opening 46. In photolithography, a pattern of radiation is generated using a photomask and an optical stepper of a lithography tool and then imaged onto the resist to define a pattern in the resist. In an alternative embodiment, the resist may be a negative resist in which regions of the resist that are not exposed to the radiation become chemically less stable to promote removal when the resist is developed and regions that are exposed to the radiation remain chemically stable so that they remain intact when the resist is developed. As a result, if the marking region 20 is coated with negative resist and is not exposed to radiation, then the resist over the marking region 20 will be developed away to form the opening.

After patterning, the reverse mask layer 44 defines an etch mask that includes a feature pattern with openings 46 that extend to the depth of the dielectric layer 32. The openings 46 over the wires 28 operate as windows that spatially coincide with the locations of the raised portions 36 of dielectric layer 32 covering the top surfaces of the wires 28. Above and near the wires 28, the reverse mask layer 44 may be a reverse image of the mask used to pattern the wires 28. The widths of these openings 46 may be slightly narrower than the widths of the respective raised portions 36 of the dielectric layer 32. One of the openings 46 in the reverse mask layer 44 exposes at least the raised portion 38 and recessed portion 40 of dielectric layer 32 over the marking region 20. If negative photoresist is used, then the opening 46 over marking region 20 is formed when this region is shuttered off such that it is not exposed during the lithography process.

Figure 4:
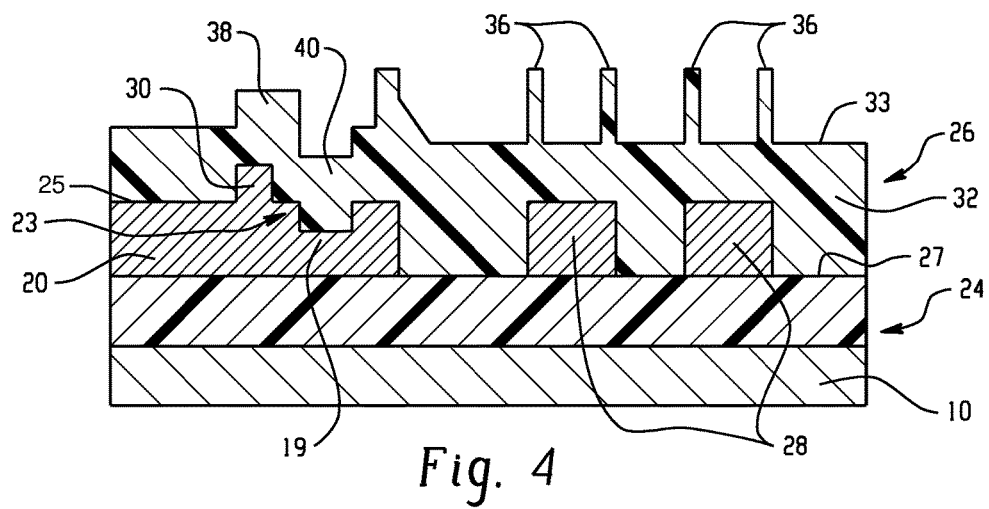

With reference to FIG. 4 in which like reference numerals refer to like features in FIG. 3 and at a subsequent fabrication stage, an etch process, is used to partially remove the dielectric material of the dielectric layer 32 that is not covered by the reverse mask layer 44. The etch process could be an anisotropic dry etch process, such as a reactive ion etching (RIE) process. The dry etch process relies on an etchant chemistry that removes the dielectric material of the dielectric layer 32. After the resist is removed by ashing or solvent stripping, the wafer 10 is cleaned using a conventional cleaning process. In an embodiment, the thickness of the metal layer constituting the wires 28 and marking region 20 is 4 microns, the dielectric layer 32 is 6 microns thick, and the etch depth of the RIE process is 4 microns.

The volume of dielectric material, which is to be removed by a subsequent polishing operation, in the raised portions 36, 38 of the dielectric layer 32 is reduced by the implementation of the reverse mask layer 44 during etching and prior to planarization. The reduction in the volume of dielectric material may be effective to reduce the polishing time needed to achieve an otherwise equivalent level of planarity.

Figure 5:
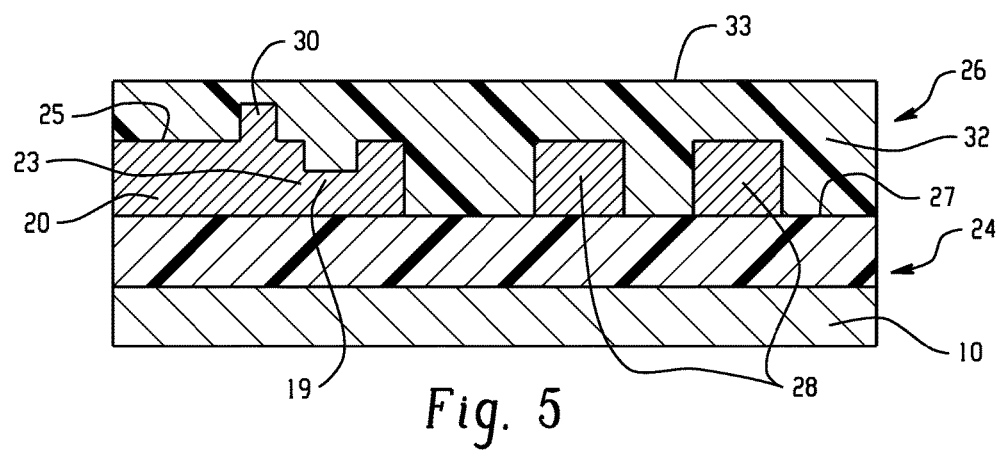

With reference to FIG. 5 in which like reference numerals refer to like features in FIG. 4 and at a subsequent fabrication stage, a polishing operation, such as chemical mechanical polishing (CMP), is conducted to polish the dielectric layer 32 by removing its constituent dielectric material until its top surface 33 is substantially planar and flat. This planarized top surface 33 may be located above the top surface of the wires 28 and also located above the top surface of the marking region 20 such that the dielectric layer 32 covers the wires 28 and marking region 20 following planarization. As the top surface 33 of the dielectric layer 32 is polished, the CMP process may completely remove the remainder of the raised portions 36, 38 of the dielectric layer 32, as well as the recessed portion 40 of the dielectric layer 32. A cleaning process, such as a 500:1 buffered HF etchant or a cryogenic clean, may be used to clean residual slurry that remains following chemical mechanical polishing.

The use of the reverse mask layer 44 in a preceding fabrication stage to partially remove the dielectric layer 42 improves the surface uniformity of the CMP process and the planarity of the dielectric layer 32. After polishing, the dielectric layer 32 defines a passivation layer in which the wires 28, the marking region 20, and the elements 23 of the identification marking 22 in the marking region 20 are embedded. After polishing, additional films may be deposited, such as silicon nitride, and vias may be opened to input/output pads (not shown).

Figure 6:
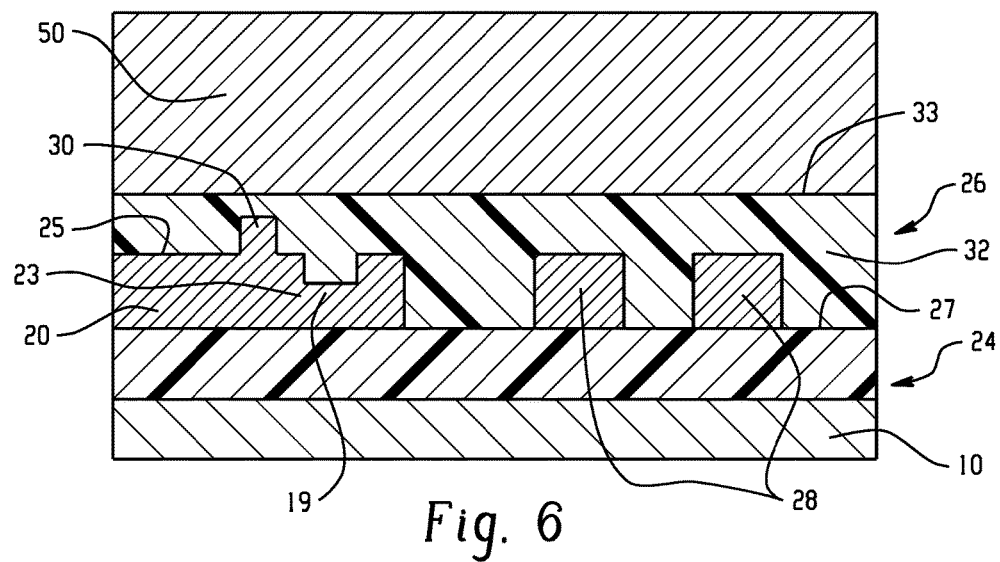

With reference to FIG. 6 in which like reference numerals refer to like features in FIG. 5 and at a subsequent fabrication stage, a substrate 50 may be attached to the front side of the wafer 10, which is covered by the dielectric layer 32, to create an assembly. Substrate 50 may be temporarily bonded to the top surface 33 or may be permanently bonded to the top surface 33, depending on the subsequent process steps. In particular, contacting surfaces of the dielectric layer 32 and substrate 50 may be bonded together by, for example, a thermal process (e.g., oxide bonding), or may be adhesively bonded using an adhesive layer, such as a layer of a polyimide adhesive like HD3007 polyimide, or may be eutectically-bonded using metal-to-metal bonding. In this bonded assembly, the top surface 33 and the surface of the substrate 50 bonded with top surface 33 are co-planar or substantially coplanar with a reduction in defectivity arising from the reduction of topography and laser scribe debris, and the improvement in planarity during polishing. Post bonding defectivity of wafers with topography over the active wire region including wires 28 or marking region 20 include embedded bubbles in the adhesive or oxide bond, cracking of the wafer 10 or films above the wafer, and cracking of the substrate 50 to which the original wafer 10 is bonded.

After the substrate 50 is attached, the wafer 10 may be thinned from its backside by grinding, etching, and/or polishing as part of a process transferring the integrated circuits to the substrate 50. If wafer 10 is an SOI wafer, the handle substrate may be fully removed from the backside, leaving the BOX layer and layers above the BOX layer bonded to the substrate 50. Additional processing, such as bonding a permanent wafer to the BOX underside and removing substrate 50, may follow, and through silicon vias, wiring, and packaging can be formed. Alternatively, additional wire and via levels could be formed on the BOX after the handle substrate is removed.

The representative embodiments of the invention are based on forming the marking on the wafer using the last wire region. However, in alternative embodiments, any wire region could be used for the marking region 20; and any material could be used for the marking region 20. For example, a deposited opaque silicon region could be formed for the marking region 20. Alternatively, the marking could occur in a deposited transparent dielectric region. In each of these alternative embodiments, a marking region 20 is formed proximate to the wafer edge that is planarized along with the rest of the active chip portion of the wafer 10.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a chip within a usable area of a wafer;
   forming a wiring region on the wafer;
   forming a marking region on the wafer;
   forming an identification marking in the marking region;
   after the identification marking is formed, depositing a dielectric layer on the marking region and the wiring region;
   forming a reverse planarization mask on the dielectric layer that includes a first opening aligned with a non-planar portion of the dielectric layer over the marking region;
   etching the dielectric layer to partially remove the dielectric layer exposed through the first opening in the reverse planarization mask;
   after the dielectric layer is etched, removing the reverse planarization mask; and
   after the reverse planarization mask is removed, planarizing the dielectric layer with a polishing operation.

2. The method of claim 1 wherein the marking region is comprised of a metal.

3. The method of claim 2 wherein the wiring region is comprised of the metal.

4. The method of claim 1 wherein the wiring region is a topmost metal layer.

5. The method of claim 1 wherein the marking region is comprised of a metal, and forming the identification marking in the marking region comprises:
   laser scribing a plurality of elements of the identification marking into the metal of the marking region.

6. The method of claim 1 further comprising:
   adhesively bonding a substrate to a planarized surface of the dielectric layer.

7. The method of claim 1 wherein the identification marking is located radially inward from an outer peripheral edge of the wafer.

8. The method of claim 1 wherein the marking region is outside of the usable area.

9. The method of claim 1 wherein a portion of the wafer underlying the marking region is free of device structures.

10. The method of claim 1 wherein the marking region is not used for making electrical connections, and the marking region is not a component of the chip.

11. The method of claim 1 wherein the dielectric layer is deposited by a high density plasma chemical vapor deposition (HDPCVD) process.

12. The method of claim 11 wherein the dielectric layer is comprised of an oxide of silicon, and the oxide formed over the wiring region is thinner than the oxide formed over the marking region.

13. The method of claim 1 wherein the reverse planarization mask includes a second opening aligned with a non-planar portion of the dielectric layer over the wiring region, and the dielectric layer exposed through the second opening in the reverse planarization mask is partially removed when the dielectric layer is etched.

\* \* \* \* \*